(12) United States Patent
Regier

(10) Patent No.: US 6,323,792 B1
(45) Date of Patent: Nov. 27, 2001

(54) METHOD FOR CORRECTING ANALOG-TO-DIGITAL CONVERTER (ADC) ERRORS, AND APPARATUS EMBODYING SAME

(75) Inventor: Christopher G. Regier, Cedar Park, TX (US)

(73) Assignee: National Instruments Corporation, Austin, TX (US)

(*) Notice: Subject to any disclaimer, the term of this patent is extended or adjusted under 35 U.S.C. 154(b) by 0 days.

(21) Appl. No.: 09/650,002

(22) Filed: Aug. 28, 2000

(51) Int. Cl.⁷ ........................................ H03M 1/06
(52) U.S. Cl. ........................... 341/118; 341/120
(58) Field of Search .................... 341/118, 120, 341/155

(56) References Cited

U.S. PATENT DOCUMENTS

| | | | |
|---|---|---|---|
| 4,667,296 | * 5/1987 | Crowe | 364/553 |
| 5,132,685 | * 7/1992 | DeWitt et al. | 341/120 |
| 5,214,430 | * 5/1993 | Gulczynski | 341/120 |
| 5,220,589 | * 6/1993 | Gard | 378/19 |
| 5,812,077 | * 9/1998 | Boie | 341/118 |
| 6,125,154 | * 9/2000 | Sutardja | 375/345 |

* cited by examiner

Primary Examiner—Peguy JeanPierre
Assistant Examiner—Joseph Lauture (74) Attorney, Agent, or Firm—Conley, Rose & Tayon, PC; Jeffrey C. Hood (57) ABSTRACT

A method for correcting output codes produced by an analog-to-digital converter (ADC), and an apparatus embodying the method. The method includes receiving a digital output code i produced by the ADC, and randomly selecting a new digital output code within a range of code values dependent upon a difference between an actual code edge transition of the digital output code i and an ideal code edge transition of the digital output code i. An n-bit ADC produces digital output codes 0 through $(2^n-1)$. Digital output codes 1 through $(2^n-1)$ have actual and ideal code edge transitions. The actual code edge transition of the digital output code i, where $1 \leq i \leq (2^n-1)$, is a transition between a digital output code i−1 and the digital output code i within an actual transfer function of the ADC, and the ideal code edge transition of the digital output code i is a transition between a digital output code i−1 and code i within an ideal transfer function of the ADC. When the ADC is an n-bit ADC, both the digital output code i and the new digital output code are n-bit values. Producing n-bit values, the method, employing a probabilistic approach to ADC code correction, is easily incorporated into measurement and control systems designed to receive n bits from an n-bit ADC. The method corrects ADC output code errors resulting from a number of error sources, including offset error, gain error, and linearity error, or any combination thereof.

29 Claims, 10 Drawing Sheets

METHOD FOR CORRECTING ANALOG-TO-DIGITAL CONVERTER (ADC) ERRORS, AND APPARATUS EMBODYING SAME

FIELD OF THE INVENTION

This invention relates to the art of analog-to-digital converters (ADCs), and more particularly, to correcting ADC errors.

DESCRIPTION OF THE RELATED ART

Analog-to-digital converters (ADCs) are circuits widely used to interface between the physical world of analog quantities and the computational world of digital processors. Analog quantities such as temperature, pressure, flow rate, and velocity, vary in a continuous manner between extremes. Transducers of measurement and control systems convert such analog quantities to analog electrical signals (e.g., analog voltages or currents). ADCs are used to convert analog electrical signals to discrete digital values. Known types of ADCs include flash, delta-sigma (or sigma-delta), sub-ranging, successive approximation, and integrating.

A typical n-bit ADC receives an analog input quantity (e.g., an analog input voltage) having a magnitude within a range of the ADC, and produces an n-bit digital output value indicative of the magnitude of the analog quantity. The range of the ADC extends from a minimum magnitude of the analog input quantity, represented by 0, to a full scale (FS) magnitude of the analog input quantity. Each bit of the n-bit binary output code produced by the typical ADC is a logic level '0' when the magnitude of the input analog quantity is 0, and a logic level '1' when the magnitude of the input analog quantity is the full scale magnitude.

As the magnitude of the input analog quantity increases from 0 to the full scale magnitude, the binary output code produced by the ADC increases. The resulting transfer function of the typical n-bit ADC resembles a flight of ($2^n-1$) steps from a minimum binary output code to a maximum binary output code.

Figure 1:
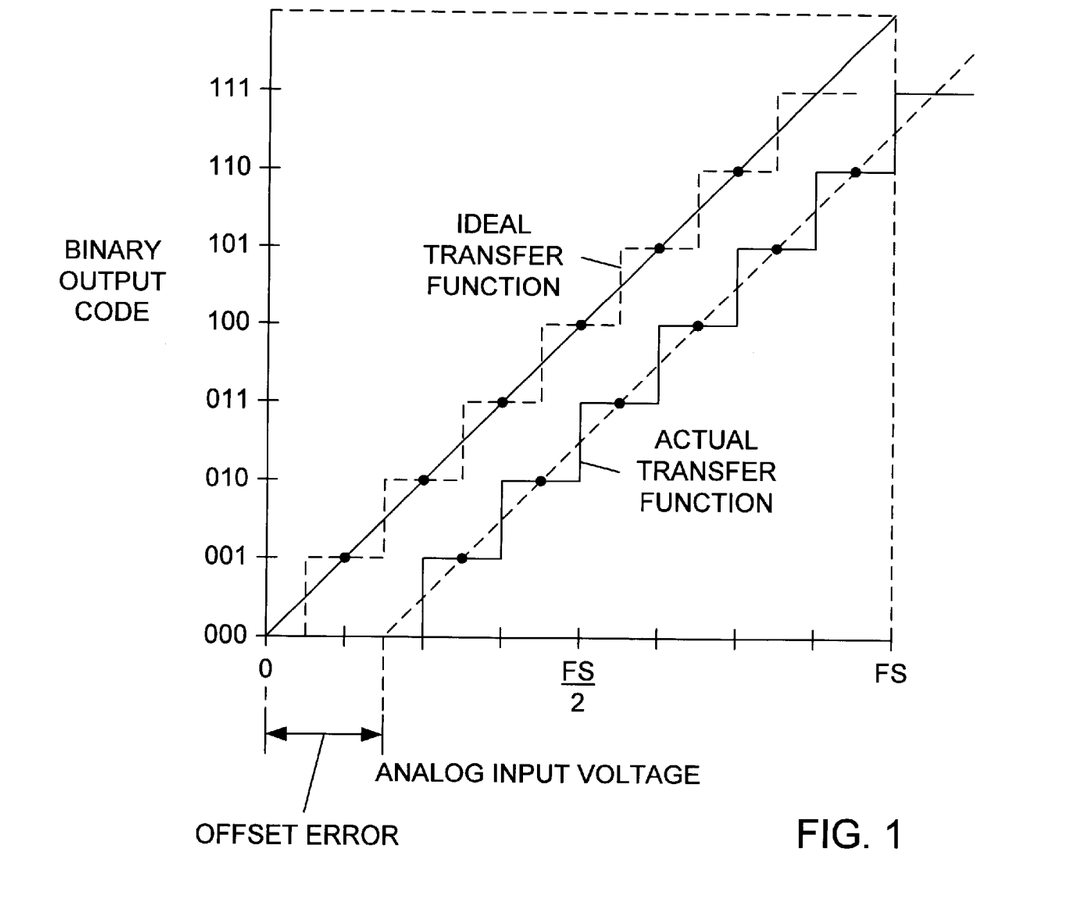
FIG. 1 is a graph of binary output code versus analog input voltage for a 3-bit analog-to-digital converter (ADC) receiving an analog input voltage, wherein an actual transfer function of the ADC deviates from an ideal transfer function due to offset error.

Unfortunately, the actual transfer function of an ADC may deviate from an ideal transfer function of the ADC due to any one of a number of error sources including offset error, gain error, and linearity error. FIG. 1 is a graph of binary output code versus analog input voltage for a 3-bit analog-to-digital converter (ADC) receiving an analog input voltage, wherein an actual transfer function of the ADC deviates from an ideal transfer function due to offset error. As indicated in FIG. 1, offset error is the analog error by which a straight line drawn through centers of the steps of the actual transfer function fails to pass through 0.

Figure 2:
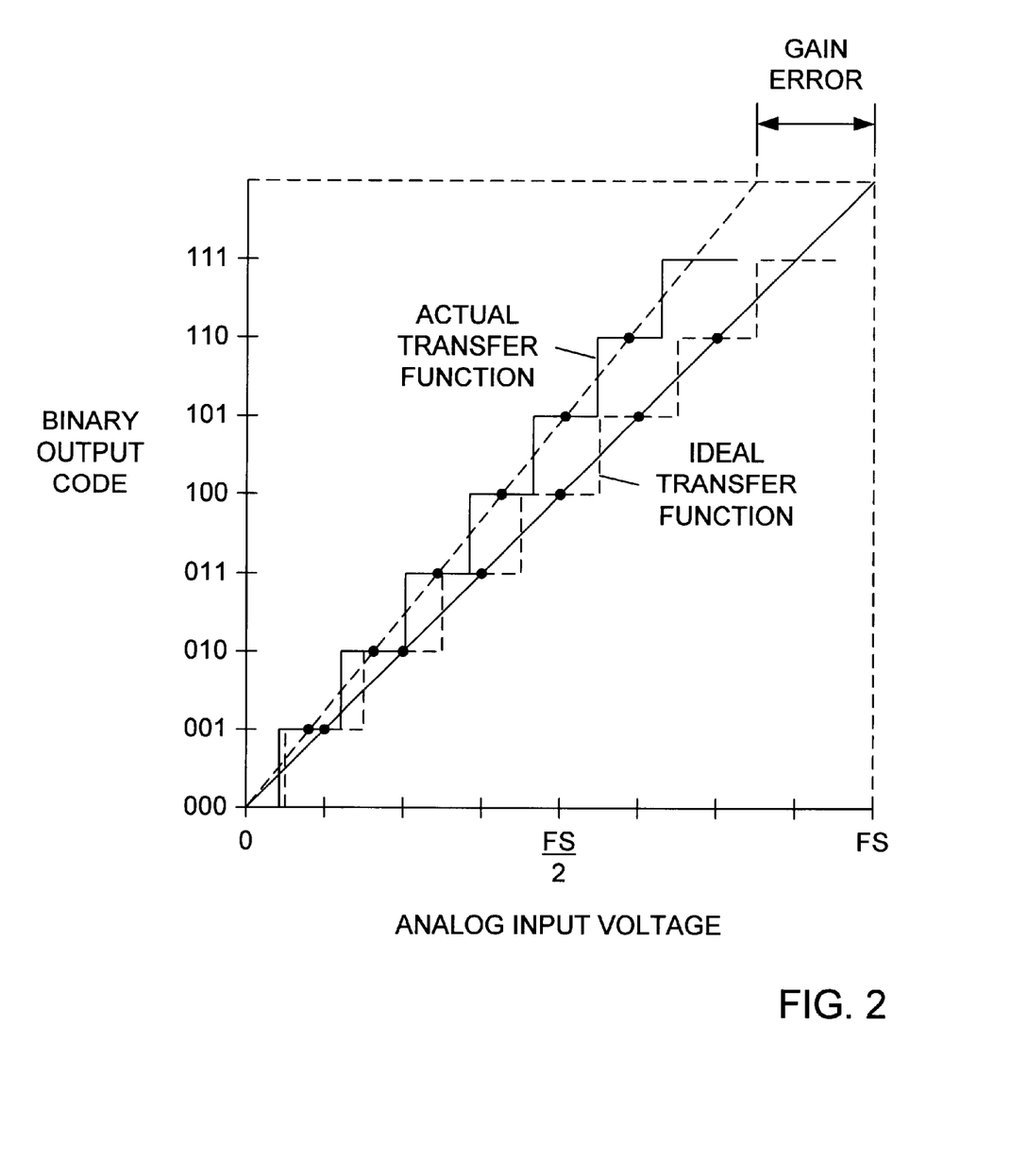
FIG. 2 is a graph of binary output code versus analog input voltage for a 3-bit ADC receiving an analog input voltage, wherein an actual transfer function of the ADC deviates from an ideal transfer function due to gain error.

FIG. 2 is a graph of binary output code versus analog input voltage for a 3-bit ADC receiving an analog input voltage, wherein an actual transfer function of the ADC deviates from an ideal transfer function due to gain error. As indicated in FIG. 2, gain error is a difference in slope between a first straight line passing through centers of steps of the actual transfer function and a second straight line passing through centers of steps of the ideal transfer function. Gain error is typically expressed as a percentage of the full scale magnitude of the analog input voltage.

Figure 3:
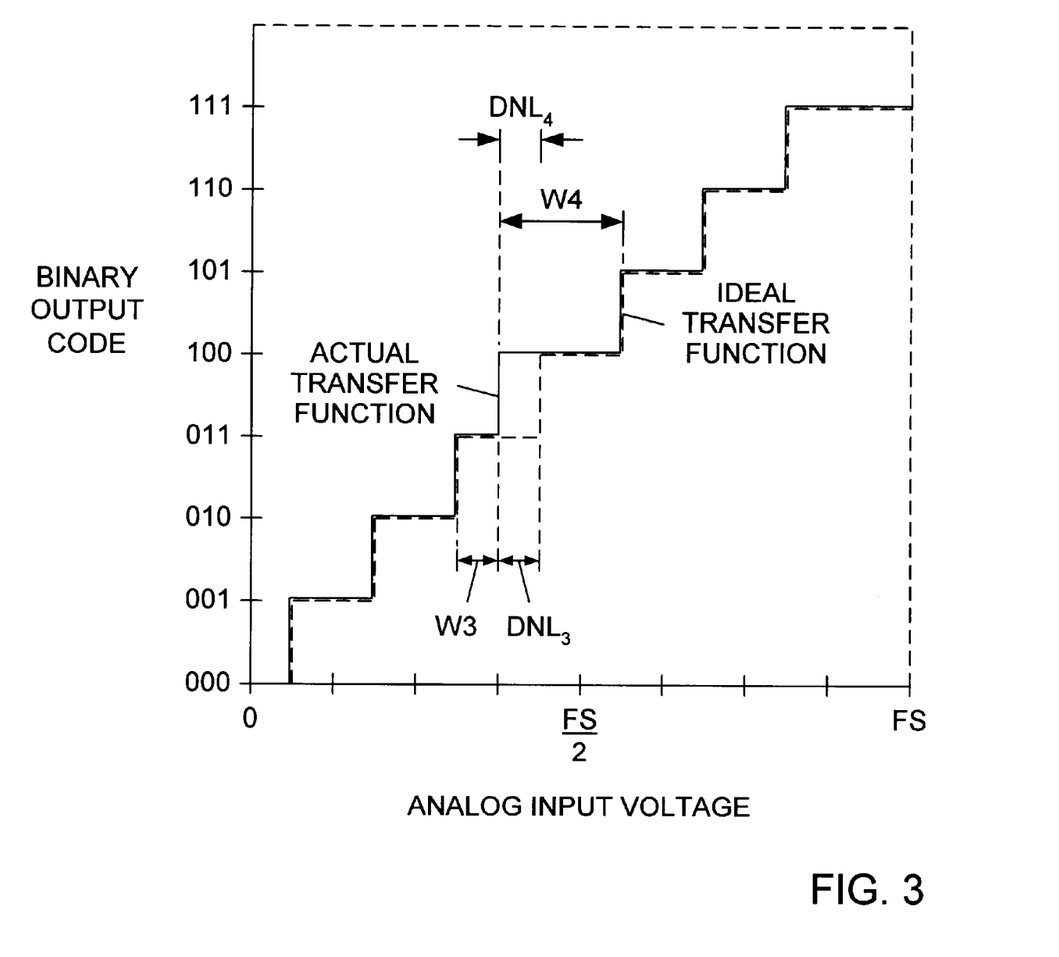
FIG. 3 is a graph of actual binary output codes produced by a 3-bit ADC and ideal binary output codes versus analog input voltage, wherein an actual transfer function of the ADC deviates from an ideal transfer function due to differential nonlinearity (DNL) in the actual transfer function of the ADC.

Linearity errors result from ADC nonlinearities generally categorized as either "integral" nonlinearity (INL) or "differential" nonlinearity (DNL). INL is defined as a maximum deviation of an actual transfer function of an ADC from a straight line passing through the centers of the steps of the ideal transfer function of the ADC. DNL is defined as a maximum amount that a width of any step of the actual transfer function differs from an ideal step width of the ADC. FIG. 3 is a graph of actual binary output codes produced by a 3-bit ADC and ideal binary output codes versus analog input voltage, wherein an actual transfer function of the ADC deviates from an ideal transfer function due to differential nonlinearity (DNL) in the actual transfer function of the ADC. In general, a width $W_i$ of the step corresponding to code i (i.e., a width $W_i$ of code i) of an n-bit ADC is ideally (FS/$2^n$) where $1 \leq i \leq (2^n-2)$. The width $W_i$ of code i of the 3-bit ADC is thus ideally (FS/8) where $1 \leq i \leq 6$. In FIG. 3, the width $W_3$ of code 3 is less than the ideal width (FS/8), and the width $W_4$ of code 4 is greater than the ideal width (FS/8). The differential nonlinearity of code 3, $DNL_3$, is equal to $W_3-(FS/8)$, and is negative. The DNL of code 4, $DNL_4$, is equal to $W_4-(FS/8)$, and is positive.

When an ADC is used in a measurement system, the above described error sources attributed to the ADC result in measurement errors. When an ADC is used in a control system, the above described error sources may result in the issuing of incorrect control signals. To reduce errors due to ADC error sources, it is known to add correction amounts to binary output codes produced by an ADC. For example, in the case of the 3-bit ADC of FIG. 2, code i produced by the 3-bit ADC may be "corrected" to (i—GAIN_ERROR(i)), where GAIN_ERROR(i) is the difference between the desired center of code i and the actual center of code i. Thus code 3 (binary code '011') produced by the 3-bit ADC may be corrected to (3–0.6), and code 4 produced by the 3-bit ADC may be corrected to (4–0.8). Where GAIN_ERROR (i) has a fractional part, the corrected value requires a binary representation exceeding n bits. For example, code 3 (binary code '011') produced by the 3-bit ADC may be corrected to 2.40 as described above. The binary representation of the corrected value 2.40 typically has an integer part '010' preceding an implied decimal point and a fractional part '011 . . . ' which follows the implied decimal point. Thus corrected code 3 is only fully represented by at least 6 bits instead of the original 3 bits '011'. To obtain a theoretically perfect correction, an infinite number of bits may be required. In practice a sufficient accuracy can be obtained with a limited number of bits which is greater than the number of bits in the original uncorrected binary data.

Many measurement and control systems are designed to receive only n bits from an n-bit ADC. It is often difficult to incorporate the above correction mechanism producing values having representations requiring greater than n bits into such systems. It would thus be desirable to have a system and method for correcting errors in an n-bit ADC which results in n-bit corrected output codes.

SUMMARY OF THE INVENTION

A method is disclosed for correcting output codes produced by an analog-to-digital converter (ADC), as is an apparatus embodying the method. The method includes receiving a digital output code i produced by the ADC, and randomly selecting a new digital output code within a range of code values dependent upon a difference between an actual code edge transition of the digital output code i and an ideal code edge transition of the digital output code i. An n-bit ADC produces digital output codes 0 through ($2^n-1$). Digital output codes 1 through ($2^n-1$) have actual and ideal code edge transitions as defined herein. The actual code edge transition of the digital output code i, where $1 \leq i \leq (2^n-1)$, is a transition between a digital output code i-1 and the digital output code i within an actual transfer function of the ADC, and the ideal code edge transition of the digital output code i is a transition between a digital output code i−1 and code i within an ideal transfer function of the ADC.

It is noted that when the ADC produces n-bit digital output codes, both the digital output code i and the new digital output code are n-bit values. Unlike other code correction approaches producing corrected output codes having more than n bits, the method, employing a probabilistic approach to ADC code correction, can be easily incorporated into measurement and control systems designed to receive only n bits from an n-bit ADC. It is also noted that the method corrects ADC output code errors resulting from a number of error sources, including offset error, gain error, and linearity error, or any combination thereof.

The new digital output code may be randomly selected within a range of code values dependent upon i, an edge nonlinearity (ENL) of the digital output code i, and an ENL of a digital output code i+1. Digital output codes 1 through ($2^n-2$) may thus be corrected using this approach. The ENL of the digital output code i may be a difference between the actual code edge transition of the digital output code i and the ideal code edge transition of the digital output code i. The digital output code i may be an n-bit value, and the analog input voltage may vary within a full-scale range (FSR) of the ADC. The ENL of the digital output code i and the ENL of the digital output code i+1 may be expressed in terms of a least significant bit (LSB) of the ADC, wherein the LSB of the ADC is equal to the FSR of the ADC divided by $2^n$. The range of code values may extend from (i−0.5+$ENL_i$) to (i+0.5+$ENL_{i+1}$), wherein $ENL_i$ is the ENL of the digital output code i, and wherein $ENL_{i+1}$ is the ENL of the digital output code i+1. The method may thus include determining an ENL value for each digital output code j produced by the ADC, where j>0.

One embodiment of an apparatus includes an ADC and code correction logic coupled to the ADC. The ADC is configurable to produce a digital output code i indicative of an analog input voltage. The code correction logic receives the digital output code i and produces a corrected digital output code dependent upon a difference between an actual code edge transition of the digital output code i and an ideal code edge transition of the digital output code i. As described above, an n-bit ADC produces digital output codes 0 through ($2^n-1$). Digital output codes 1 through ($2^n-1$) have actual and ideal code edge transitions as defined above.

The code correction logic may produce the corrected digital output code by randomly selecting the corrected digital output code within a range of code values dependent upon i, an edge nonlinearity (ENL) of code i, and an ENL of code i+1. The code correction logic may thus produce corrected digital output codes for ADC output codes 1 through ($2^n-2$). The digital output code i may be an n-bit value, and the analog input voltage may vary within a full-scale range (FSR) of the ADC. The ENL of code i and the ENL of code i+1 may be expressed in terms of a least significant bit (LSB) of the ADC, wherein the LSB of the ADC is equal to the FSR of the ADC divided by $2^n$. The range of code values may extend from (i−0.5+$ENL_i$) to (i+0.5+$ENL_{i+1}$), wherein $ENL_i$ is the ENL of code i, and wherein $ENL_{i+1}$, is the ENL of code i+1. Again, when the ADC produces n-bit digital output codes, both the digital output code i and the corrected digital output code are n-bit values.

The apparatus may include a calibration source for determining the difference between an actual code edge transition of the digital output code i and an ideal code edge transition of the digital output code i (i.e., the ENL of digital output code i). The calibration source may produce a triangle wave signal having an amplitude sufficient to span a full scale input range (i.e., FSR) of the ADC. A number of counts for each binary output code produced by the ADC over a period of time when the ADC receives the triangle wave signal may be used to determine the ENL of digital output code i, where i>0. The calibration source may also produce precision direct current (d.c.) voltages for accurately determining the FSR and/or the offset of the ADC.

BRIEF DESCRIPTION OF THE DRAWINGS

A better understanding of the present invention can be obtained when the following detailed description of the preferred embodiment is considered in conjunction with the following drawings, in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENT

Figure 4:
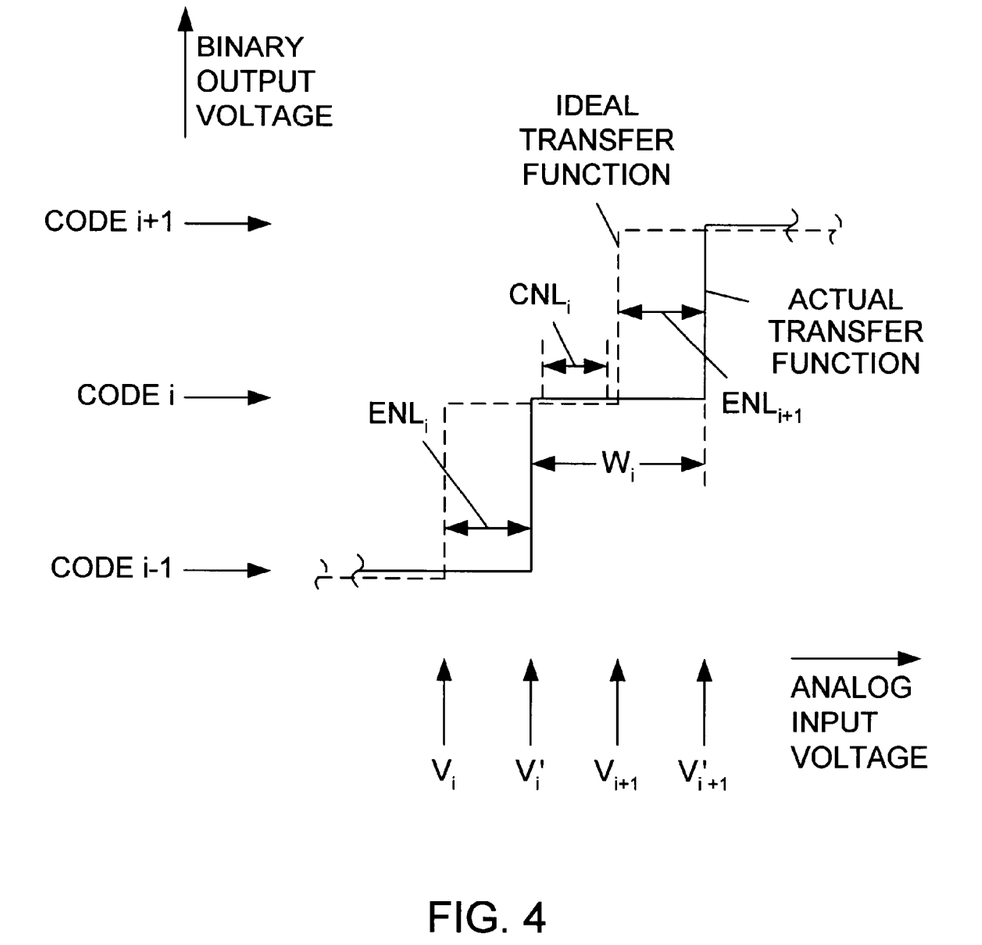
FIG. 4 is a portion of a graph of actual binary output codes produced by an ADC and ideal binary output codes versus analog input voltage illustrating introduced concepts of edge nonlinearity (ENL) and center nonlinearity (CNL) in the actual transfer function of the ADC, and wherein the binary output codes include a code i.

FIG. 4 is a portion of a graph of actual binary output codes produced by an ADC and ideal binary output codes versus analog input voltage illustrating introduced concepts of edge nonlinearity (ENL) and center nonlinearity (CNL) in the actual transfer function of the ADC. Ideally, the transfer function of the ADC should transition from code i−1 to code i when the analog input voltage is $V_1$. However, the actual transfer function of the ADC transitions from code i−1 to code i when the analog input voltage is $V_i'$, where $V_i'$ is greater than $V_i$. The actual transfer function of the ADC has an edge nonlinearity ENLi associated with code i and equal to $(V_i'-V_i)$. As $V_i'$ is greater than $V_i$, $ENL_i$ is positive. In addition, the transfer function of the ADC should ideally transition from code i to code i+1 when the analog input voltage is $V_{i+1}$. However, the actual transfer function of the ADC transitions from code i to code i+1 when the analog input voltage is $V_{i+1}'$, where $V_{i+1}'$ is greater than $V_{i+1}$. The actual transfer function of the ADC has an edge nonlinearity $ENL_{i+1}$ associated with code i+1 and equal to $(V_{i+1}'-V_{i+1})$. As $V_{i+1}'$ is greater than $V_{i+1}$, $ENL_{i+1}$ is positive. The actual transfer function of the ADC also has a center nonlinearity associated with code i, $CNL_i$, as illustrated in FIG. 4. $CNL_i$ has a magnitude equal to the difference between the center of the actual width $W_i$ of code i and the center of the ideal width of code I, and is positive.

As used herein, the term "edge nonlinearity," abbreviated ENL, is used to describe a difference between an actual code edge transition and the corresponding ideal code edge transition. It is noted that $ENL_i$ associated with code i may result from a number of error sources, including offset error, gain error, and linearity error, or any combination thereof. It is also noted that offset, gain, and linearity errors are known to change with time and temperature. As used herein, the term "center nonlinearity," abbreviated CNL, is used to describe a difference between an actual code center and the corresponding ideal code center.

Figure 5:
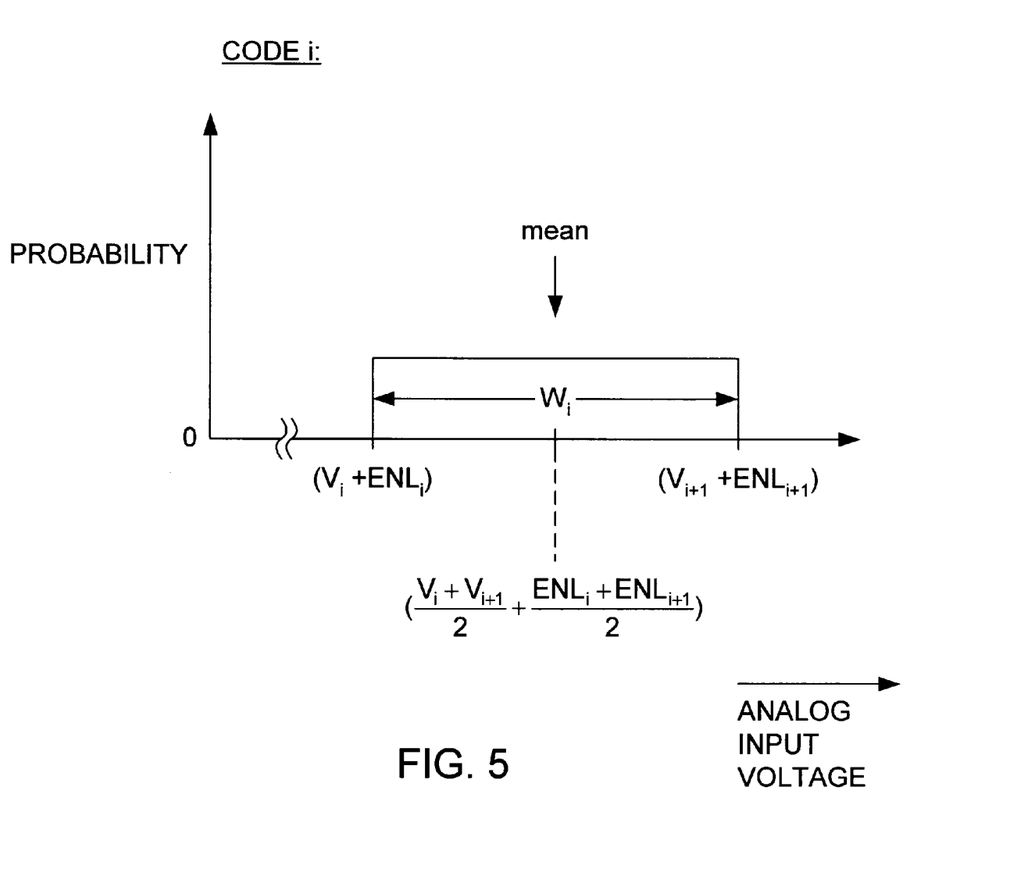
FIG. 5 is a diagram illustrating a uniform distribution of the analog input voltage associated with code i of FIG. 4.

FIG. 5 is a diagram illustrating the uniform distribution of the analog input voltage associated with code i of FIG. 4. As shown in FIG. 5, the probability of the analog input voltage of code i being: (i) less than $V_i'=(V_i+ENL_i)$ is 0, (ii) between $V_i'=(V_i+ENL_i)$ and $V_{i+1}'=(V_{i+1}+ENL_{i+1})$ is a constant, and (iii) greater than $V_{i+1}'=(V_{i+1}+ENL_{i+1})$ is 0. The mean of the uniform distribution of the analog input voltage of code i is equal to $\{(V_i+V_{i+1})/2+(ENL_i+ENL_{i+1})/2\}$, and the range of the distribution is $\{(V_{i+1}+ENL_{i+1})-(V_i+ENL_i)\}=W_i$.

It is possible to correct errors in the transfer function of an ADC (i.e., offset, gain, and/or linearity errors) in a probabilistic manner by: (i) receiving a code i from the ADC, (ii) randomly selecting an analog input voltage from the range of analog input voltages which may have produced code i, (iii) producing a new "corrected" code i by requantizing the randomly selected analog input voltage according to the ideal transfer function.

Figure 6:
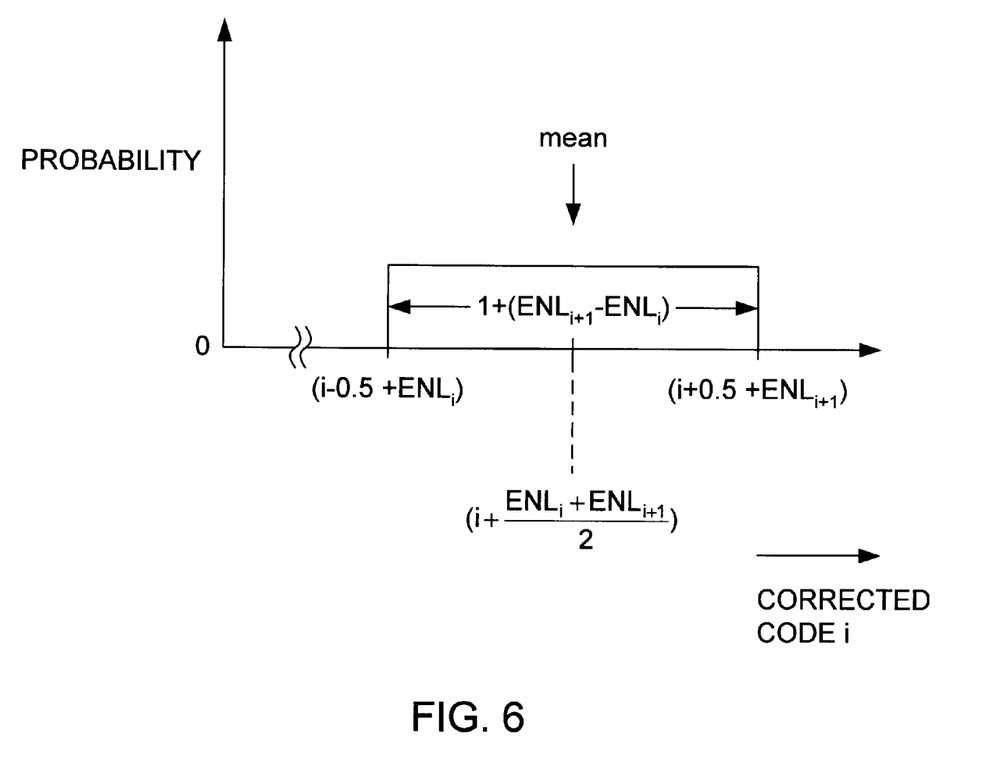
FIG. 6 is a diagram illustrating the uniform distribution of a corrected code i resulting from code correction steps.

FIG. 6 will now be used to describe how the above random selection and requantizing steps can be combined into a single step. FIG. 6 is a diagram illustrating the uniform distribution of the corrected code i resulting from the above random selection and requantizing steps. FIG. 6 is produced by mapping the uniform distribution of the analog input voltage of code i (FIG. 5) to the corresponding uniform distribution of the ideal output code (i.e., corrected code i) resulting from code i. As shown in FIG. 6, the probability of the corrected code i being: (i) less than $(i-0.5+ENL_i)$ is 0, (ii) between $(i-0.5+ENL_i)$ and $(i+0.5+ENL_{i+1})$ is a constant, and (iii) greater than $(i+0.5+ENL_{i+1})$ is 0. The mean of the uniform distribution of the corrected code i is equal to $\{i+(ENL_i+ENL_{i+1})/2\}$, and the range of the distribution is $\{1+ENL_i-ENL_{i+1}\}$.

Figure 7:
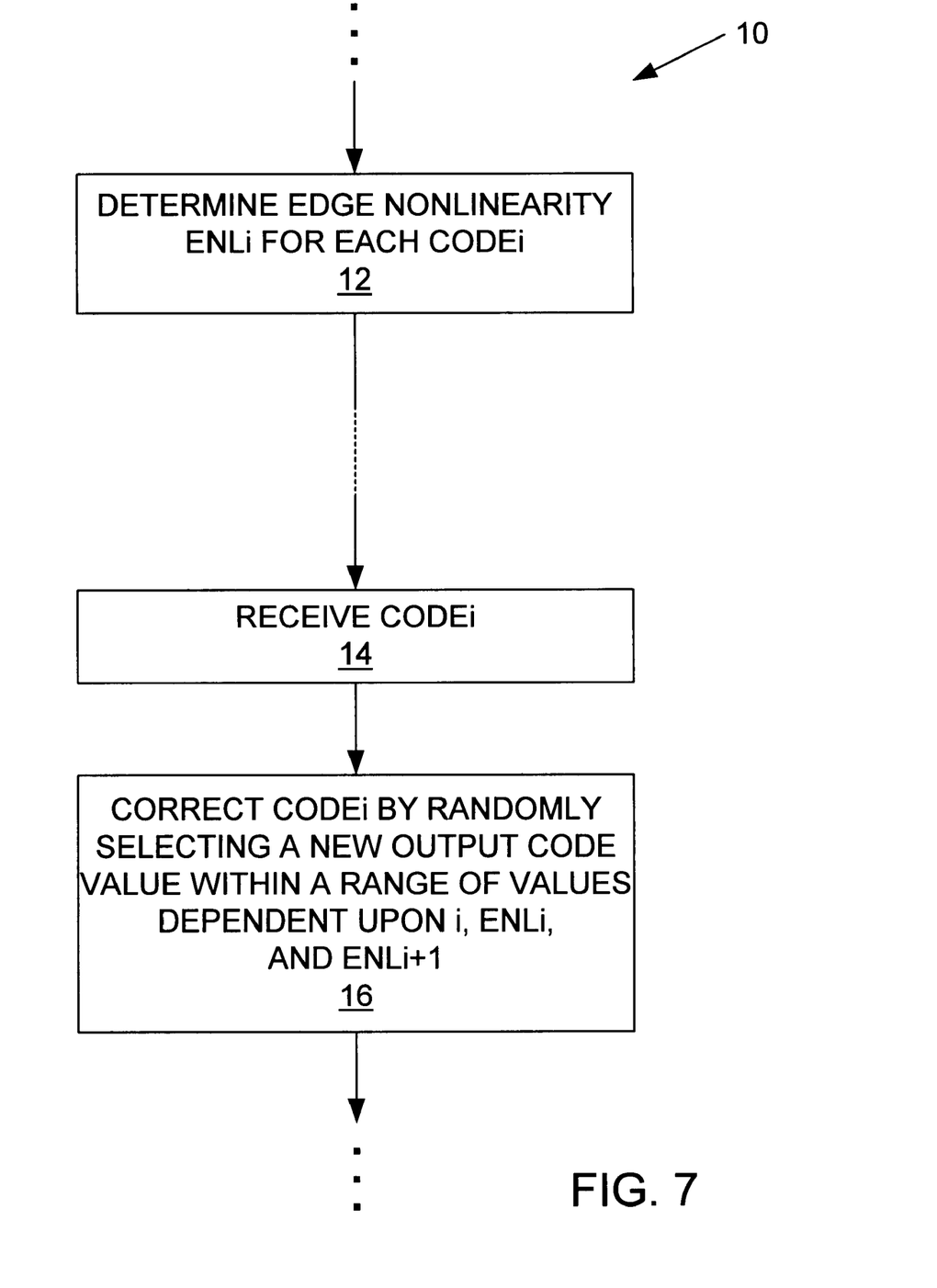
FIG. 7 is a flow chart of one embodiment of a method for correcting codes produced by an ADC.

FIG. 7 is a flow chart of one embodiment of a method 10 for correcting codes produced by an ADC. A first step of the method is to determine the edge nonlinearity $ENL_i$ for each code i produced by the ADC (e.g., during a calibration procedure). Once determined, the values of $ENL_i$ may be used to correct codes produced by the ADC. A code i produced by the ADC may be corrected by: (i) receiving the code i, and (ii) randomly selecting a new "corrected" output code value within a range of values dependent upon i, $ENL_i$, and $ENL_{i+1}$.

As described above, the range of values may extend from $(i-0.5+ENL_i)$ to $(i+0.5+ENL_{i+1})$. A random number generator may be used to generate a real number at random between $(i-0.5+ENL_i)$ and $(i+0.5+ENL_{i+1})$. The real number may have an integer part (e.g., preceding an implied decimal point) and a fractional part (e.g., following the implied decimal point). The real number is preferably rounded to the nearest integer.

Figure 8:
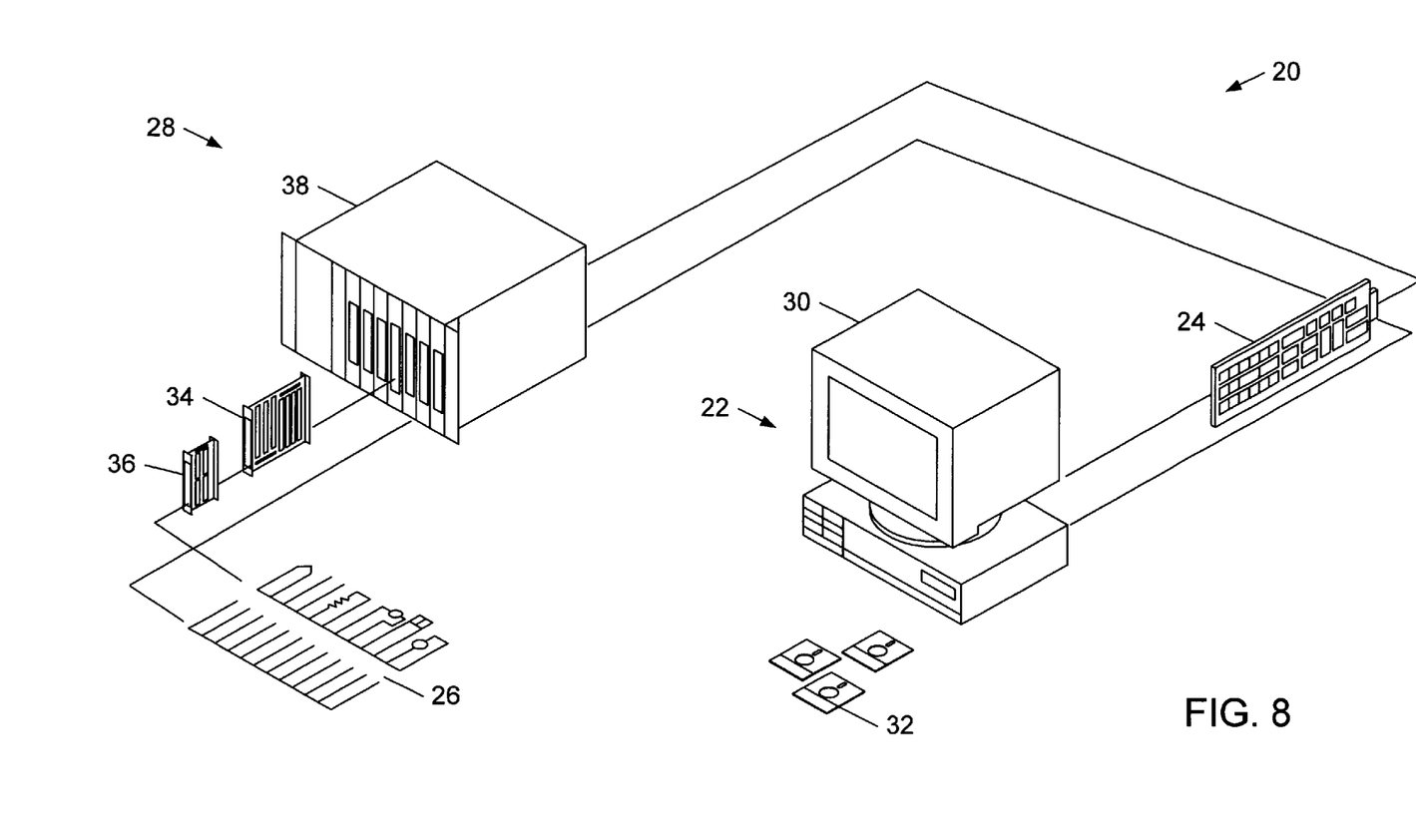
FIG. 8 is a perspective view of a computer-based data acquisition system including an ADC and circuitry embodying the method of FIG. 7 for correcting digital output codes produced by the ADC.

FIG. 8 is a perspective view of a computer-based data acquisition system 20 including an ADC and circuitry embodying the above described method 10 for correcting digital output codes produced by the ADC. Data acquisition system 20 includes a computer system 22, a data acquisition card 24, one or more transducers 26, and signal conditioning subsystem 28. Computer system 22 includes computer 30 and storage media 32. Computer 30 may include various standard components, including at least one central processing unit (CPU), a memory, a hard drive, one or more buses, and a power supply. Computer 30 may execute operating system and other software. Computer 30 may store measurement data received from data acquisition card 24 and/or signal conditioning subsystem 28 within the memory or upon storage media 32. Storage media 32 may include, for example, magnetic floppy disks.

Signal conditioning subsystem 28 includes one or more signal conditioning modules 34 and one or more terminal blocks 36 housed within a chassis 38. Transducers 26 convert one or more measurands (e.g., temperature, pressure, velocity, acceleration, etc.) to analog electrical measurement signals. Exemplary transducers 26 include strain gauges, thermocouples, thermistors, pressure transducers, accelerometers, and photoconductive cells, among others. Transducers 26 may be coupled to signal conditioning subsystem 28 by wires or cables, and may provide the analog electrical measurement signals to signal conditioning subsystem 28 via the wires or cables.

Signal conditioning subsystem 28 conditions (e.g., amplifies, filters, performs d.c. level shifting upon, etc.) the analog electrical measurement signals received from transducers 26. Signal conditioning subsystem 28 may be coupled to data acquisition board 24 and computer system 22 by wires or cables, and may provide the conditioned analog electrical measurement signals to data acquisition board 24 and/or computer system 22 via the wires or cables.

Chassis 38 may be a signal conditioning extensions for instrumentation (SCXI) chassis, signal conditioning modules 34 may be SCXI signal conditioning modules, and terminal blocks 36 may be SCXI terminal blocks. SCXI is an open architecture, multi-channel signal conditioning front-end system for data acquisition systems. SCM includes an external chassis housing signal conditioning modules for amplifying, multiplexing, and isolating electrical measurement signals. SCXI signal conditioning modules advantageously reduce the introduction of noise into analog electrical measurement signals.

Data acquisition card 24 receives analog electrical measurement signals from signal conditioning subsystem 28 and converts the analog electrical measurement signals to corresponding digital output codes. Data acquisition card 24 includes an ADC and circuitry embodying the above described method 10 for correcting digital output codes produced by the ADC. In FIG. 8, data acquisition card 24 is shown external to computer 30 for illustrative purposes. Data acquisition card 24 may be coupled to an input/output (I/O) port of computer 30, or adapted for insertion into an expansion slot of computer 30. Alternately, data acquisition card 24 may be coupled to computer 30 by a VME extensions for instrumentation (VXI) chassis and bus or a general purpose interface bus (GPIB).

Figure 9:
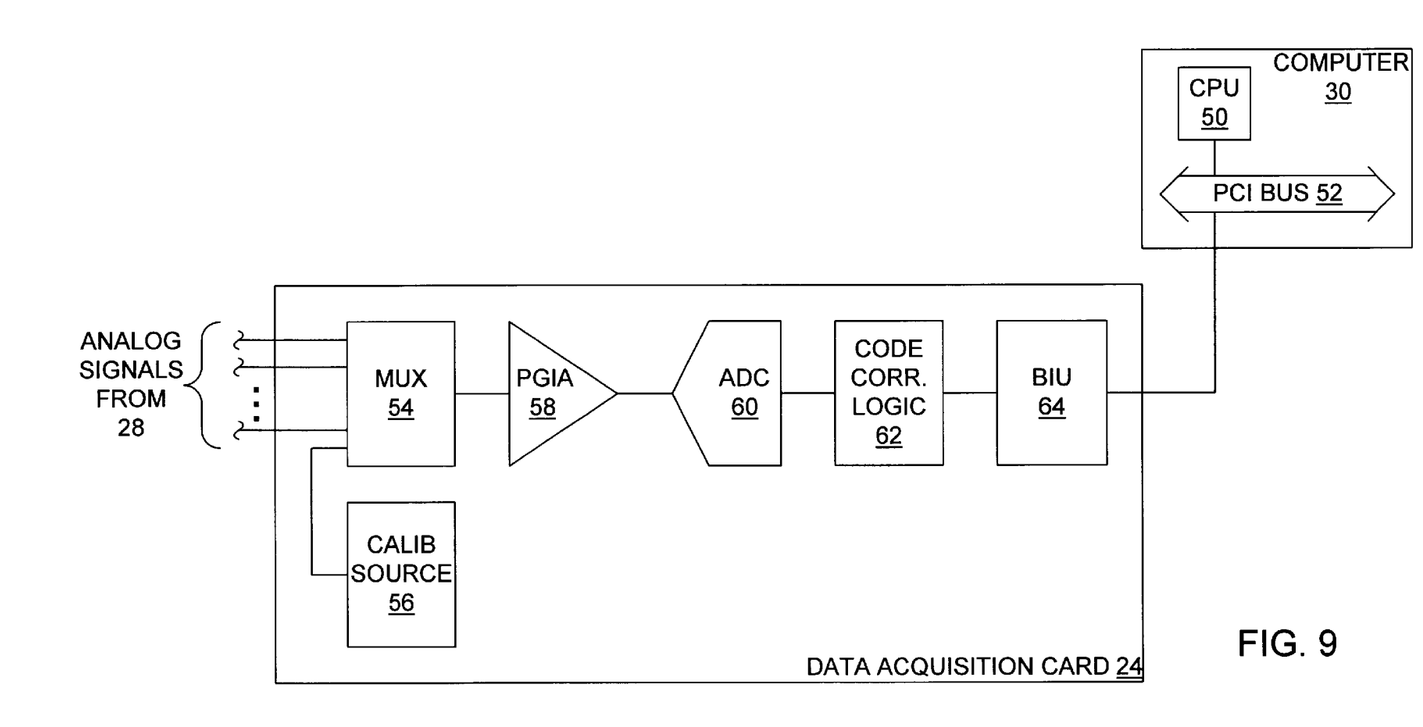
FIG. 9 is a diagram of embodiments of a computer and a data acquisition card of the data acquisition system of FIG. 8, wherein the data acquisition card includes an ADC and code correction logic coupled to the ADC for correcting codes produced by the ADC.

FIG. 9 is a diagram of embodiments of computer 30 and data acquisition card 24 of FIG. 8. In the embodiment of FIG. 9, computer 30 includes a CPU 50 coupled to a peripheral component interconnect (PCI) bus 52. Data acquisition card 24 is configured for coupling to PCI bus 52. Data acquisition card 24 includes a multiplexer 54, a calibration source 56, a programmable gain instrumentation amplifier (PGIA) 58, an ADC 60, code correction logic 62 for correcting codes produced by ADC 60, and a bus interface (BIU) 64 which forms an interface between data acquisition card 24 and PCI bus 52 of computer 30.

Multiplexer 54 receives multiple analog electrical measurement signals from signal conditioning subsystem 28 (e.g., via different channels), and an analog calibration signal produced by calibration source 56 via a dedicated calibration channel. The analog calibration signal produced by calibration source 56 is used to determine the ENL values of the codes produced by ADC 60. Multiplexer 54 produces one of the analog electrical measurement signals from signal conditioning subsystem 28, or the analog calibration signal produced by calibration source 56, as an analog output signal dependent upon one or more control signals, and provides the analog output signal to PGIA 58. PGIA 58 amplifies the analog output signal of multiplexer 54, and provides the amplified analog output signal to ADC 60.

ADC 60 converts the amplified analog output signal of multiplexer 54 to corresponding n-bit binary output codes. ADC 60 may be any one of various types of ADCs, including integrating, flash, sigma-delta, sub-ranging, and successive approximation, among others. Code correction logic 62 embodies the above described method 10 for correcting codes produced by ADC 60. During a calibration operation, the analog calibration signal produced by calibration source 56 may be provided to ADC 60, and the edge nonlinearity $ENL_i$ for each code i produced by ADC 60 may be determined. During normal operation, code correction logic 62 uses the edge nonlinearities $ENL_i$ to correct codes produced by the ADC. In accordance with method 10 described above, code correction logic 62 may receive a code i produced by ADC 60, randomly select a new "corrected" output code value within a range of values dependent upon i, $ENL_i$, and $ENL_{i+1}$, and produce the corrected code value at an output.

Figure 10:
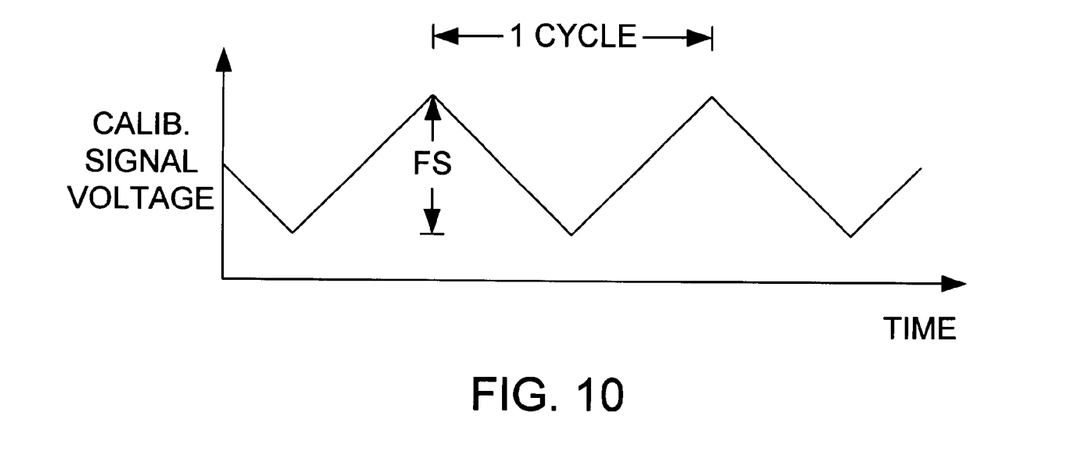
FIG. 10 is a graph of signal voltage versus time for the analog calibration signal produced by a calibration source of the data acquisition card of FIG. 9, wherein the analog calibration signal is a triangle wave having an amplitude sufficient to span a full scale input range (i.e., FSR) of the ADC.
Figure 11:
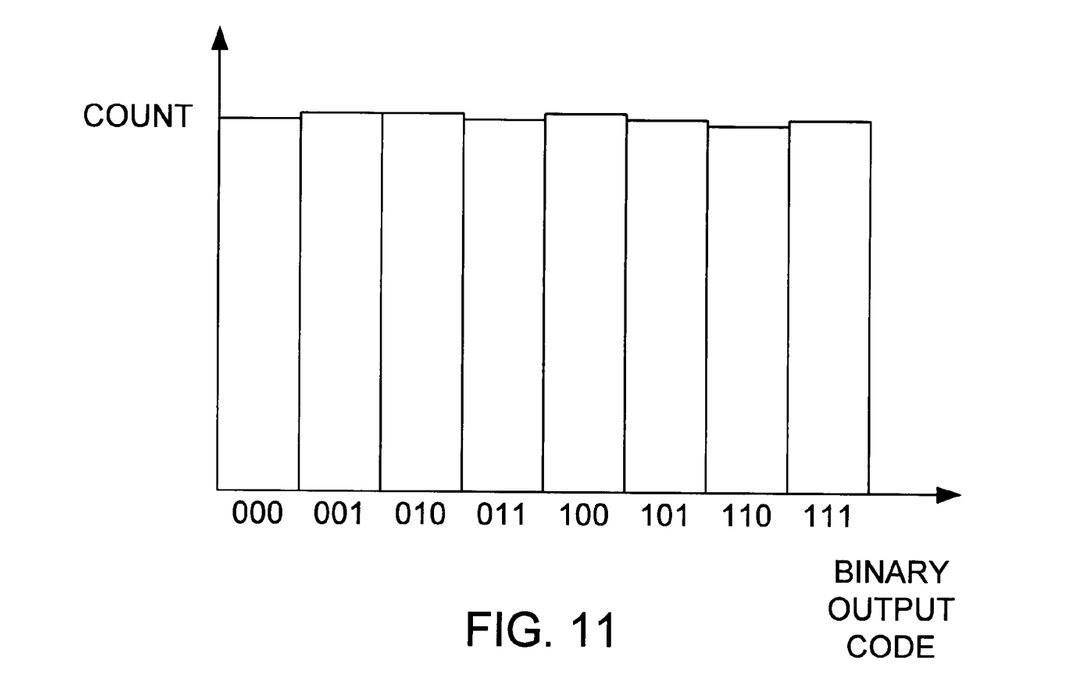
FIG. 11 is a histogram of a number of counts of binary output codes produced by a 3-bit ADC of the data acquisition card of FIG. 9 over a period of time when the ADC receives the triangle wave of FIG. 10.

FIGS. 10 and 11 will now be used to describe how the edge nonlinearity $ENL_i$ for each code i produced by ADC 60 may be determined by applying the analog calibration signal produced by calibration source 56 to ADC 60 during the calibration operation. FIG. 10 is a graph of signal voltage versus time for the analog calibration signal produced by calibration source 56 of FIG. 9, wherein the analog calibration signal is a triangle wave having an amplitude sufficient to span the full scale input range (i.e., FSR) of the ADC.

FIG. 11 is a histogram of the number of counts of binary output codes produced by a 3-bit ADC 60 of FIG. 9 over a period of time when ADC 60 receives the triangle wave of FIG. 10 (e.g., during the calibration operation). A width $W_i$ of code i relative to a width $W_j$ of code j is proportional to the ratio of the number of counts for binary output code i to the number of counts for binary output code j. The relative width of output code i may be used to determine the edge nonlinearity $ENL_i$ of code i. For example, if for an n-bit ADC, "$n_{AVG}$" represents the average number of counts for codes 1 through $(2^n-2)$, then the differential nonlinearity $DNL_i$ of code i may then be computed as $\{(n_i-n_{AVG})/n_{AVG}\}$, where $1 \leq i \leq (2^n-2)$, and where $n_i$ is the number of counts for code i.

It is noted that the analog calibration signal produced by calibration source 56 may also include precision direct current (d.c.) voltages for accurately determining the actual FSR and/or the offset of ADC 60. In the following equations, OFFSET is the error associated with the first code transition, and GAIN_ERROR is equal to $\{(\text{actual FSR})/(\text{desired FSR})-1\}$. The edge nonlinearity $ENL_i$ of code i, including gain and/or offset errors, may be computed as follows:

$ENL_i = \text{OFFSET}$, where i=1, and $$ENL_i = OFFSET + \sum_{j=1}^{i-1} DNL_i + (i-1)(\text{GAIN\_ERROR},$$

where $2 \leq i \leq (2^n - 2)$.

It is noted that an ADC coupled to, or including, circuitry embodying method 10 for correcting codes produced by the ADC may be useful in any number of other types of systems where an analog signal is converted to a digital value. Such systems include industrial automation systems, process control systems, audio systems, and video acquisition systems. It is also noted that method 10 may be embodied within computer software including instructions to be executed by a computer system CPU. For example, method 10 may be embodied within software residing within the memory of computer 30 of FIG. 8, and may include instructions to be executed by the CPU of computer system 30.

Numerous variations and modifications will become apparent to those skilled in the art once the above disclosure is fully appreciated. It is intended that the following claims be interpreted to embrace all such variations and modifications.

What is claimed is:

1. A method for correcting output codes produced by an analog-to-digital converter (ADC), comprising:

the ADC generating a digital output code i;

receiving the digital output code i produced by the ADC; and generating a new digital output code in response to said receiving the digital output code i, wherein said generating comprises randomly selecting the new digital output code within a range of code values dependent upon a difference between an actual code edge transition of the digital output code i and an ideal code edge transition of the digital output code i.

2. The method of claim 1, wherein the actual code edge transition of the digital output code i is a transition between a digital output code i−1 and the digital output code i within an actual transfer function of the ADC.

3. The method of claim 1, wherein the ideal code edge transition of the digital output code i is a transition between a digital output code i−1 and code i within an ideal transfer function of the ADC.

4. The method of claim 1, wherein the digital output code i is an n-bit value, and wherein $1 \leq i \leq (2^n-2)$.

5. A method for correcting output codes produced by an analog-to-digital converter (ADC), comprising:

the ADC generating a digital output code i;

receiving the digital output code i produced by the ADC; and generating a new digital output code in response to said receiving the digital output code i, wherein said generating comprises randomly selecting the new digital output code within a range of code values dependent upon i, an edge nonlinearity (ENL) of the digital output code i, and an ENL of a digital output code i+1.

6. The method of claim 5, wherein the ENL of the digital output code i is a difference between an actual code edge transition of the digital output code i and an ideal code edge transition of the digital output code i.

7. The method of claim 6, wherein the actual code edge transition of the digital output code i is a transition between a digital output code i−1 and the digital output code i within an actual transfer function of the ADC.

8. The method of claim 6, wherein the ideal code edge transition of the digital output code i is a transition between a digital output code i−1 and the digital output code i within an ideal transfer function of the ADC.

9. The method of claim 5, wherein the digital output code i is an n-bit value, and wherein $1 \leq i \leq (2^n-2)$.

10. The method of claim 5, wherein the digital output code i is an n-bit value, and wherein the analog input voltage varies within a full-scale range FSR) of the ADC.

11. The method of claim 10, wherein the ENL of the digital output code i and the ENL of the digital output code i+1 are expressed in terms of a least significant bit (LSB) of the ADC, and wherein the LSB of the ADC is equal to the FSR of the ADC divided by $2^n$.

12. The method of claim 5, wherein the digital output code i and the new digital output code are n-bit values.

13. The method of claim 5, wherein the range of code values extends from $(i-0.5+ENL_i)$ to $(i+0.5+ENL_{i+1})$, wherein $ENL_i$ is the ENL of the digital output code i, and wherein $ENL_{i+1}$ is the ENL of the digital output code i+1.

14. The method of claim 5, further comprising:

determining an edge nonlinearity (ENL) value for each digital output code j produced by the ADC, where j>0.

15. An apparatus, comprising:

an analog-to-digital converter (ADC) configurable to produce a digital output code i indicative of an analog input voltage; and code correction logic coupled to receive the digital output code i and configured to produce a corrected digital output code dependent upon a difference between an actual code edge transition of the digital output code i and an ideal code edge transition of the digital output code i.

16. The apparatus of claim 15, wherein the actual code edge transition of the digital output code i is a transition between a digital output code i−1 and the digital output code i within an actual transfer function of the ADC.

17. The apparatus of claim 15, wherein the ideal code edge transition of the digital output code i is a transition between a digital output code i−1 and the digital output code i within an ideal transfer function of the ADC.

18. The apparatus of claim 15, wherein the digital output code i is an n-bit value, and wherein $1 \leq i \leq (2^n-2)$.

19. The apparatus of claim 15, further comprising a calibration source selectively coupled to the ADC for determining the difference between an actual code edge transition of the digital output code i and an ideal code edge transition of the digital output code i.

20. The apparatus of claim 19, wherein the calibration source produces a triangle wave signal having an amplitude sufficient to span a full scale input range of the ADC.

21. The apparatus of claim 20, wherein the calibration source also produces precision direct current (d.c.) voltages within the full scale input range of the ADC.

22. An apparatus, comprising:

an analog-to-digital converter (ADC) configurable to produce a digital output code i indicative of an analog input voltage; and code correction logic which stores a plurality of possible corrected digital output codes, wherein the code correction logic is coupled to receive the digital output code i and configured to produce a corrected digital output code by randomly selecting the corrected digital output code within a range of code values dependent upon i, an edge nonlinearity (ENL) of code i, and an ENL of code i+1.

23. The apparatus of claim 22, wherein the digital output code i is an n-bit value, and wherein the analog input voltage varies within a full-scale range (FSR) of the ADC.

24. The apparatus of claim 23, wherein the ENL of code i and the ENL of code i+1 are expressed in terms of a least significant bit (LSB) of the ADC, and wherein the LSB of the ADC is equal to the FSR of the ADC divided by $2^n$.

25. The apparatus of claim 22, wherein both the digital output code i and the new output code are n-bit values.

26. The apparatus of claim 22, wherein the range of code values extends from $(i-0.5+ENL_i)$ to $(i+0.5+ENL_{i+1})$, wherein $ENL_i$ is the ENL of code i, and wherein $ENL_{i+1}$ is the ENL of code i+1.

27. The apparatus of claim 22, further comprising a calibration source selectively coupled to the ADC for determining the ENL of code i.

28. The apparatus of claim 27, wherein the calibration source produces a triangle wave signal having an amplitude sufficient to span a full scale input range of the ADC.

29. The apparatus of claim 28, wherein the calibration source also produces precision direct current (d.c.) voltages within the full scale input range of the ADC.

* * * * *